United States Patent
Lee et al.

(10) Patent No.: US 7,444,199 B2
(45) Date of Patent: Oct. 28, 2008

(54) METHOD FOR PREPARING MASK AND WAFER DATA FILES

(75) Inventors: Hsin-Ying Lee, Taipei County (TW); Chien-Chao Huang, Hsin-Chu (TW); Chih-Chiang Tu, Tauyen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/626,218

(22) Filed: Jan. 23, 2007

(65) Prior Publication Data

US 2008/0114483 A1 May 15, 2008

Related U.S. Application Data

(60) Provisional application No. 60/865,024, filed on Nov. 9, 2006.

(51) Int. Cl.
*G06F 19/00* (2006.01)
*G06F 17/50* (2006.01)
*G05B 19/42* (2006.01)

(52) U.S. Cl. ............... 700/121; 700/86; 700/97; 700/117; 716/19; 250/492.3; 707/104.1

(58) Field of Classification Search ............ 700/86, 700/97, 117, 120, 121; 716/19, 21; 250/492.3; 438/949; 707/101, 104.1
See application file for complete search history.

(56) References Cited

U.S. PATENT DOCUMENTS

| | | | |
|---|---|---|---|
| 6,056,785 A * | 5/2000 | Chisaka | 716/19 |
| 6,703,170 B1 * | 3/2004 | Pindo | 430/5 |
| 2002/0059317 A1 * | 5/2002 | Black et al. | 707/200 |
| 2004/0107412 A1 * | 6/2004 | Pack et al. | 716/19 |
| 2005/0091632 A1 * | 4/2005 | Pierrat et al. | 716/20 |

* cited by examiner

*Primary Examiner*—Sean P Shechtman
(74) *Attorney, Agent, or Firm*—Haynes Boone, LLP

(57) ABSTRACT

A method for converting a data file into a writer file for a mask writer is provided. A plurality of sub-files is created from the data file. The plurality of sub-files is transferred to the mask writer. A plurality of writer files is created from the plurality of sub-files at the mask writer. The transferring the plurality of sub-files to the mask writer, creating a plurality of writer files from the plurality of sub-files at the mask writer, and checking the plurality of transferred sub-files at the mask writer are executed in parallel in a single process.

17 Claims, 9 Drawing Sheets

METHOD FOR PREPARING MASK AND WAFER DATA FILES

RELATED APPLICATION

This application claims priority to U.S. Provisional Patent Application Ser. No. 60/865,024, filed on Nov. 9, 2006, entitled "Method for Preparing Mask and Wafer Data Files," which is hereby incorporated by reference in its entirety.

BACKGROUND

In semiconductor manufacturing technology, circuit designs, structure and layouts (generically referred to as "patterns") are typically designed and stored in one or more data files. The data files are then provided to a "writer." A writer is a device used to convert the data file to an image on a substrate, such as a mask (reticle) or a semiconductor wafer.

It is well known that in semiconductor manufacturing technology, patterns are becoming increasingly complex. This can be a result of various items, including a reduced critical-dimension (CD) for the images, larger image size, and more intricate patterns. As a result, the size of the corresponding data file(s) also increases. This leads to a longer data preparation cycle. For example, as the CD size decreases from 80 nm to 65 nm, the typical size of a corresponding data file increases from about 330 GB to about 1000 GB. In addition, the cycle time of data preparation for the data files increases from about 5 days to about 10 days. This provides many different drawbacks, including increased delay, possibility for error, and computational requirements.

Therefore, a need exists for a method that reduces data preparation requirements. In this way, preparation of mask or wafer data files may be more efficient and less investment is needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to photolithography, such as can be used for fabrication of semiconductor devices. It is understood, however, that specific embodiments are provided as examples to teach the broader inventive concept, and one of ordinary skill in the art can easily apply the teachings of the present disclosure to other methods and systems. Also, it is understood that the methods discussed in the present disclosure include some conventional structures and/or steps. Since these structures and steps are well known in the art, they will only be discussed in a general level of detail. Furthermore, reference numbers are repeated throughout the drawings for the sake of convenience and clarity, and such repetition does not indicate any required combination of features or steps throughout the drawings.

Figure 1:
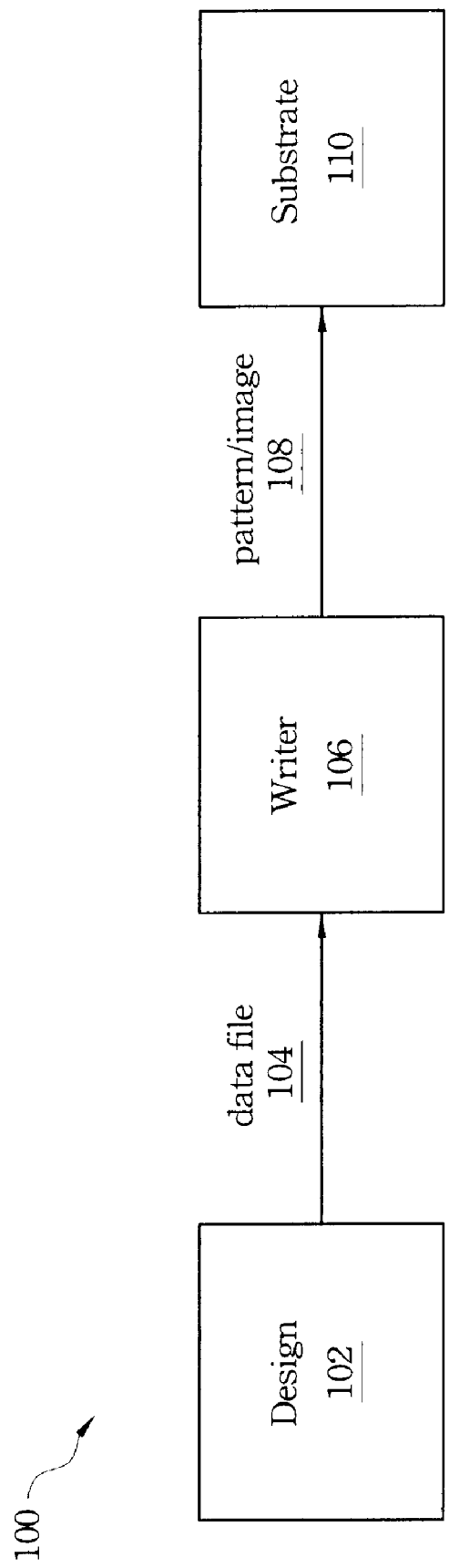
FIG. 1 is a flow diagram of an exemplary process for writing a pattern onto a substrate.

Referring to FIG. 1, an exemplary process for writing a pattern or image onto a substrate is designated with reference number 100. The process begins at step 102, where a design 102 is made for a pattern to be transferred to a substrate. The design 102 may be provided by either the customer or an engineer. The design 102 is typically embodied in one or more data files 104. The process then continues to step 106 to transfer the data file 104 to a writer 106. An example of a writer is an electron-beam writer for direct write onto either a mask or a wafer. Once the writer 106 receives the data file 104, an exposure is performed by the writer to write a pattern or image 108 onto a substrate 110. The substrate may be a mask or a wafer depending on the implementation.

Figure 2:
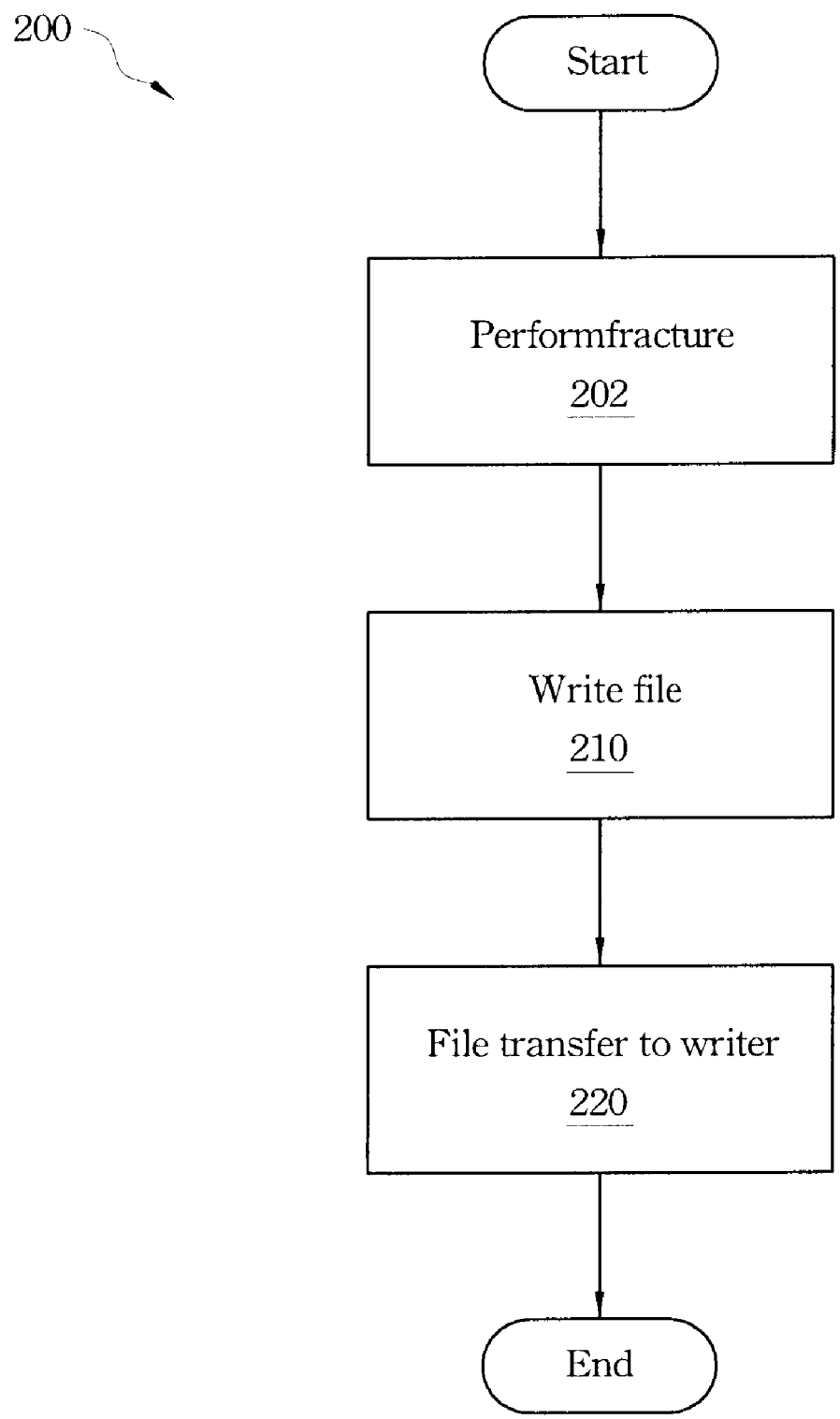
FIG. 2 is a flow diagram of an exemplary process for preparing data files used for providing an image to a substrate such as a mask or wafer.

Referring to FIG. 2, an exemplary process for preparing mask and wafer data files and providing the files to a writer is designated with the reference numeral 200. At step 202, a "fracture" process is performed on the data files. At step 210, a "write-file" process converts data from the fracture process (a flat poly format) into a unique file format used by different writers, for example, a vsb12 format of Toshiba corporation. At step 220, a "file-transfer" process transfers the converted data to the writer. More details regarding the fracture process 202 and the file-transfer process 220 are discussed with reference to FIGS. 3 and 4 below. It is noted that steps 202 to 220 are performed in sequence.

Figure 3:
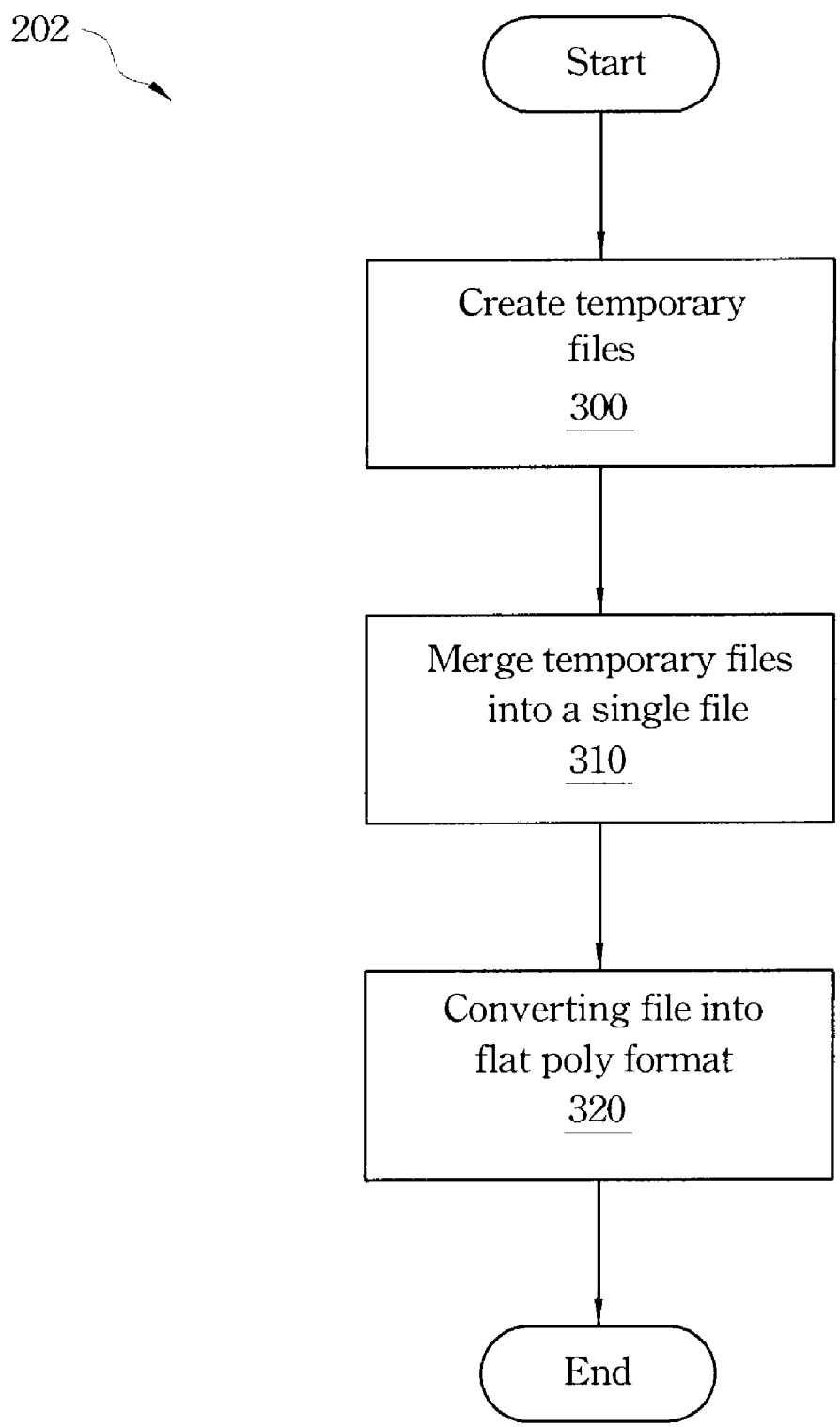
FIG. 3 is a flow diagram of a fracture process, as used in the process of FIG. 2.

Referring to FIG. 3, in one embodiment, the fracture process 202 begins at step 300 by creating temporary files. Temporary files are individual files created by individual machines that are batched to the host machine for merging. The process then continues to step 310 to merge the temporary files into a single file. Next, the process continues to step 320 to convert the single file into a flat poly format. The flat poly format is a format used by an electronic design and analysis (EDA) tool, for example, a Synopsys® tool. It is noted that steps 300 to 320 are also performed in sequence.

Figure 4:
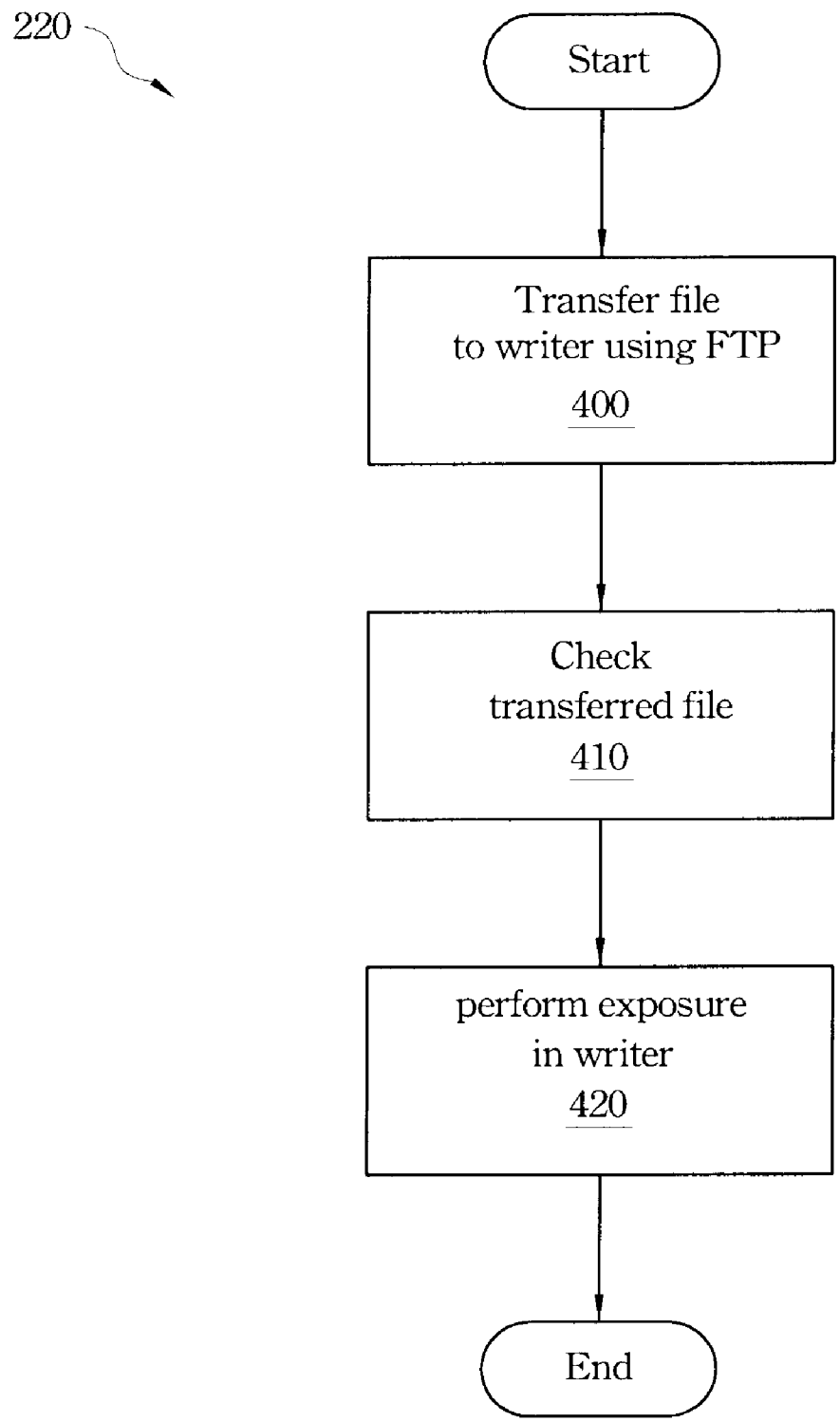
FIG. 4 is a flow diagram of a file-transfer process, as used in the process of FIG. 2.

Referring to FIG. 4, the file-transfer process 220 begins at step 400 to transfer the file produced at the write-file process 210 to the writer using a File Transfer Protocol (FTP). After the file is transferred into the writer, the process continues to step 410 to check the file transferred. The file is checked to ensure that writer is able to perform exposure later on as well as no errors occurred during the transfer of file. After the file is checked, the process continues to step 420 to perform exposure in the writer using the file data. It is also noted that steps 400 to 420 are performed in sequence.

In the method described above, the write-file step 210 is a required step prior to exposure. In addition, the merging of temporary files into a single file 310 requires significant hardware resources and thus increases data preparation cycle time. Furthermore, all of the steps and processes above are performed in sequence. Thus, the number of required CPUs and hardware equipment increases as the size of the data file increases.

Figure 5:
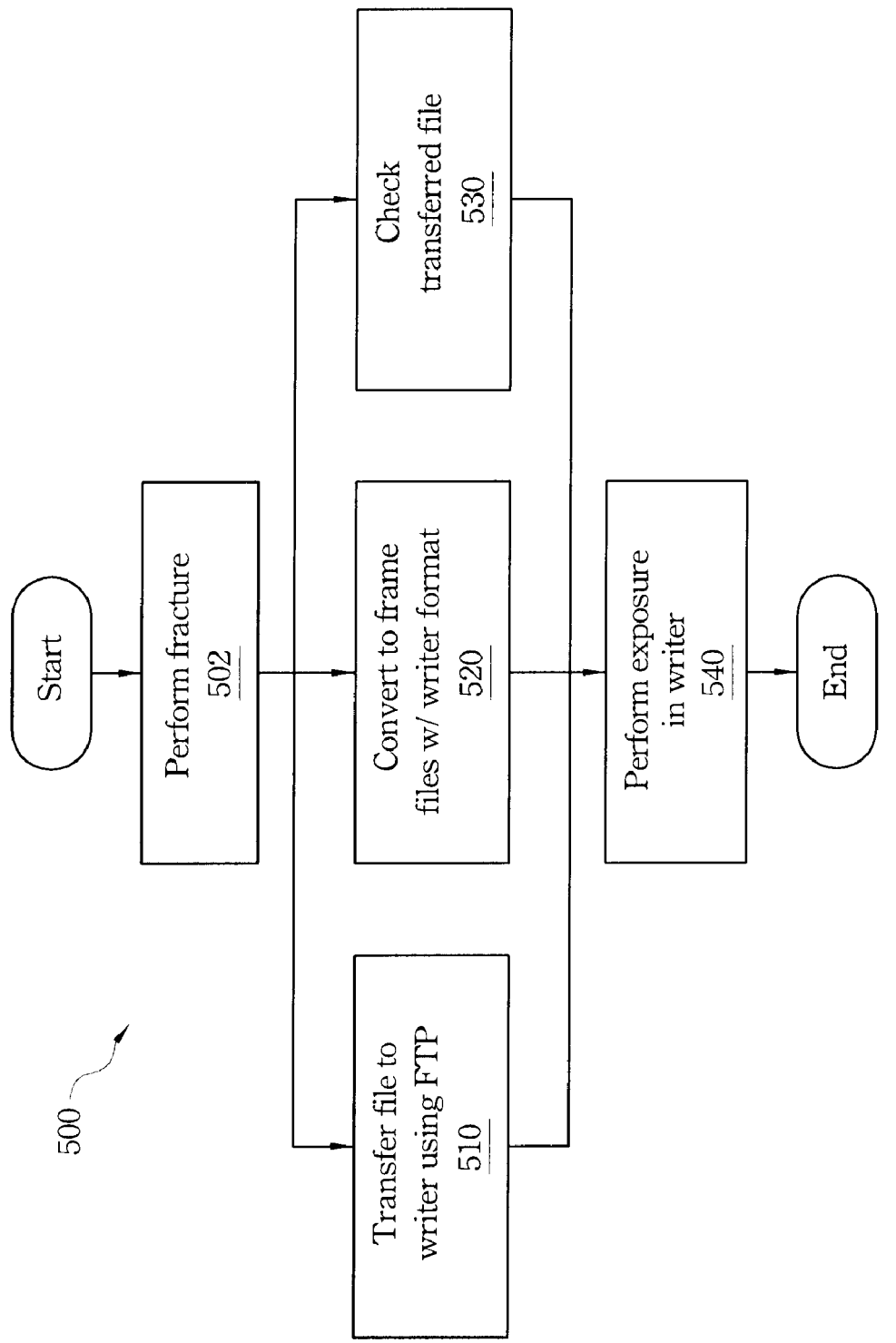
FIG. 5 is a flow diagram of another or additional exemplary process for preparing data files used for providing an image to a substrate such as a mask or wafer.

Referring to FIG. 5, another embodiment of an exemplary process for reducing data preparation cycle time is generally designated with the reference numeral 500. Execution begins at step 502 to perform a fracture process. Embodiments of the fracture process 502 are discussed with reference to FIG. 6 below. The process then continues to multiple steps which can be executed in parallel, including a file-transfer process 510, a conversion process 520, and a file-checking process 530. The conversion process 520 converts the flat poly files into a format that is recognized by a specific writer. Upon completion of processes 510, 520, and 530, the process 500 proceeds to step 540 to perform exposure in the writer. It is noted that in this illustrative embodiment, the write-file step 210 (FIG. 2) is eliminated from the process.

Figure 6:
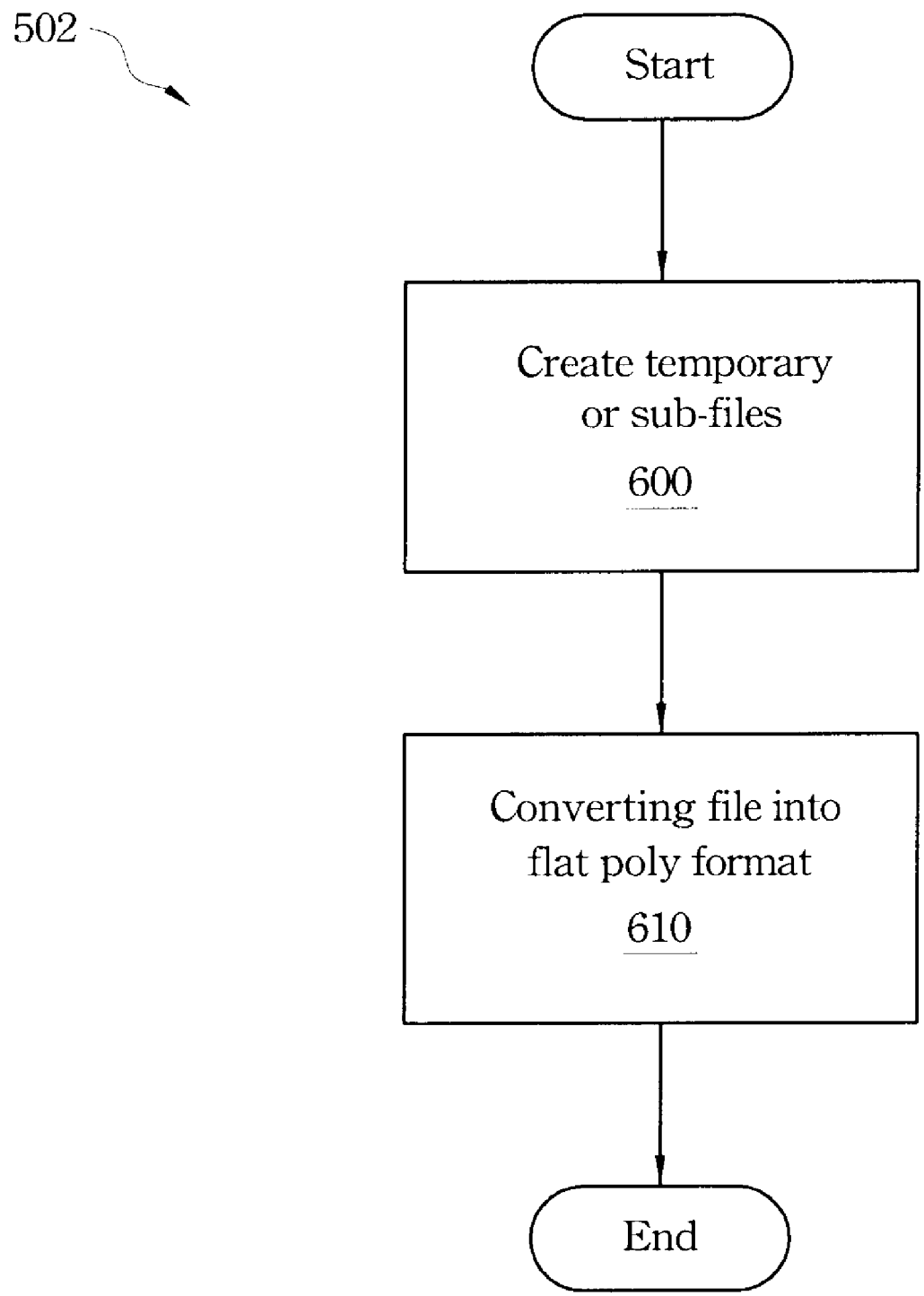
FIG. 6 is a flow diagram of a new fracture process, as used in the process of FIG. 5.

Referring to FIG. 6, the fracture process 502 begins at step 600 by creating plenty of temporary files. The temporary files may also be referred to as sub-files. The process 502 then continues to step 610 to convert data in the temporary files into a flat poly format. It is noted that in this illustrative embodiment, the file merging step 310 (FIG. 3) is eliminated from the fracture process 502, because parallel operations may now be performed on each individual temporary or sub-file instead of a merged file. For example, individual flat poly files may be converted to individual frame files in parallel operations. The data in the individual frame files may be understood by a specific writer. The ability to convert flat poly files to frame files is tremendously essential because, as the size of devices dramatically decreases, different writers may be used to write a pattern onto a mask.

By performing the file-transfer process 510, the conversion process 520, and the file-checking process 530 in parallel for each individual sub-file, the file merging step 310 (FIG. 3) and the write-file step 210 (FIG. 2) may be removed. As a result, data preparation cycle time is reduced and hardware resource required for these steps is minimized. Thus, the need for additional CPUs and hardware equipment is eliminated.

Figure 7:
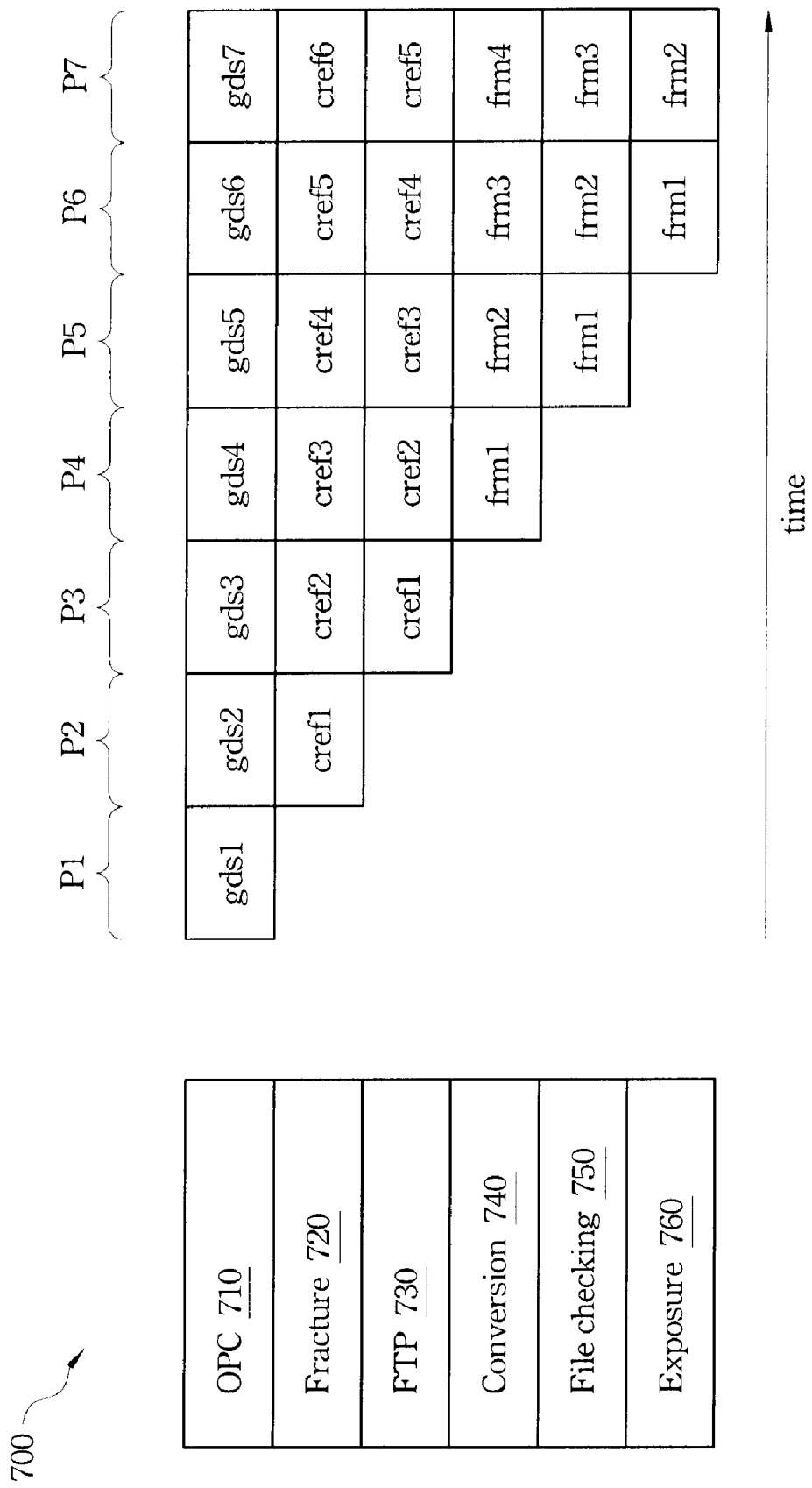
FIG. 7 is a diagram illustrating a parallel data preparation process provided by aspects of the present disclosure.

Referring to FIG. 7, for the sake of example and to describe additional embodiments, a parallel data preparation process 700 performs multiple sub-processes in parallel. The multiple sub-processes include an optical proximity correction (OPC) process 710, a fracture process 720, a file-transfer process 730, a conversion process 740, a file-checking process 750, and an exposure process 760. These sub-processes may be executed simultaneously by a single CPU or hardware.

In process 1 (P1), OPC process 710 is first performed to generate data for a first data file (gds1). In process 2 (P2), a fracture process 720 is performed to create a first flat poly file (cref1) from the first data file (gds1), while at the same time, OPC process 710 is performed to generate data for a second data file (gds2). The data of flat poly file is in a format that is used by EDA tools.

In process 3 (P3), a file-transfer process 730 is performed on the first flat poly file (cref1), while at the same time, the fracture process 720 is performed to generate a second flat poly file (cref2) from the second data file (gds2), and OPC process 710 is performed to generate data for a third data file (gds3).

In process 4 (P4), a conversion process 740 is performed to convert the first flat poly file (cref1) into a first frame file (frm1). The data of the frame file is in a format that is understood by a specific writer. At the same time, a file-transfer process 730 may be performed on the second flat poly file (cref2), a fracture process 720 may be performed to generate a third flat poly file (cref3) from the third data file (gds3), and OPC process 710 is performed to generate data for a fourth data file (gds4).

In process 5 (P5), a file-checking process 750 is performed on the first frame file (frm1) to verify the data, while at the same time, a conversion process 740 is performed to convert the second flat poly file (cref2) into a second frame file (frm2), a file-transfer process 730 is performed on the third flat poly file (cref3), a fracture process 720 is performed to generate a fourth flat poly file (cref4) from the fourth data file (gds4), and OPC process 710 is performed to generate data for a fifth data file (gds5).

In process 6 (P6), the writer uses the first frame file (frm1) to perform exposure process 760, while at the same time, a file-checking process 750 is performed on the second frame file (frm2) to verify the data, a conversion process 740 is performed to convert the third flat poly file (cref3) into a third frame file (frm3), a file-transfer process 730 is performed on the fourth flat poly file (cref4), a fracture process 720 is performed to generate a fifth flat poly file (cref5) from the fifth data file (gds5), and OPC process 710 is performed to generate data for a sixth data file (gds6).

In process 7 (P7), the writer uses the second frame file (frm2) to perform exposure 760, while at the same time, a file-checking step 750 is performed on the third frame file (frm3) to verify the data, a conversion process 740 is performed to convert the fourth flat poly file (cref4) into a fourth frame file (frm4), a file-transfer process 730 is performed on the fifth flat poly file (cref5), a fracture process 720 is performed to generate a sixth flat poly file (cref6) from the sixth data file (gds6), and OPC process 710 is performed to generate data for a seventh data file (gds7). The parallel processes (P1-P7) continue to execute as time progresses and may be repeated until all of the temporary or sub-files are processed at the writer. At any given process, data preparation is performed on different sub-files. By dividing the data file into sub-files, the process time for each sub-file is tremendously much shorter than the process time for the merged file in the sequential method and the number of CPUs or hardware required to process the sub-files is reduced as a result.

Figure 8:
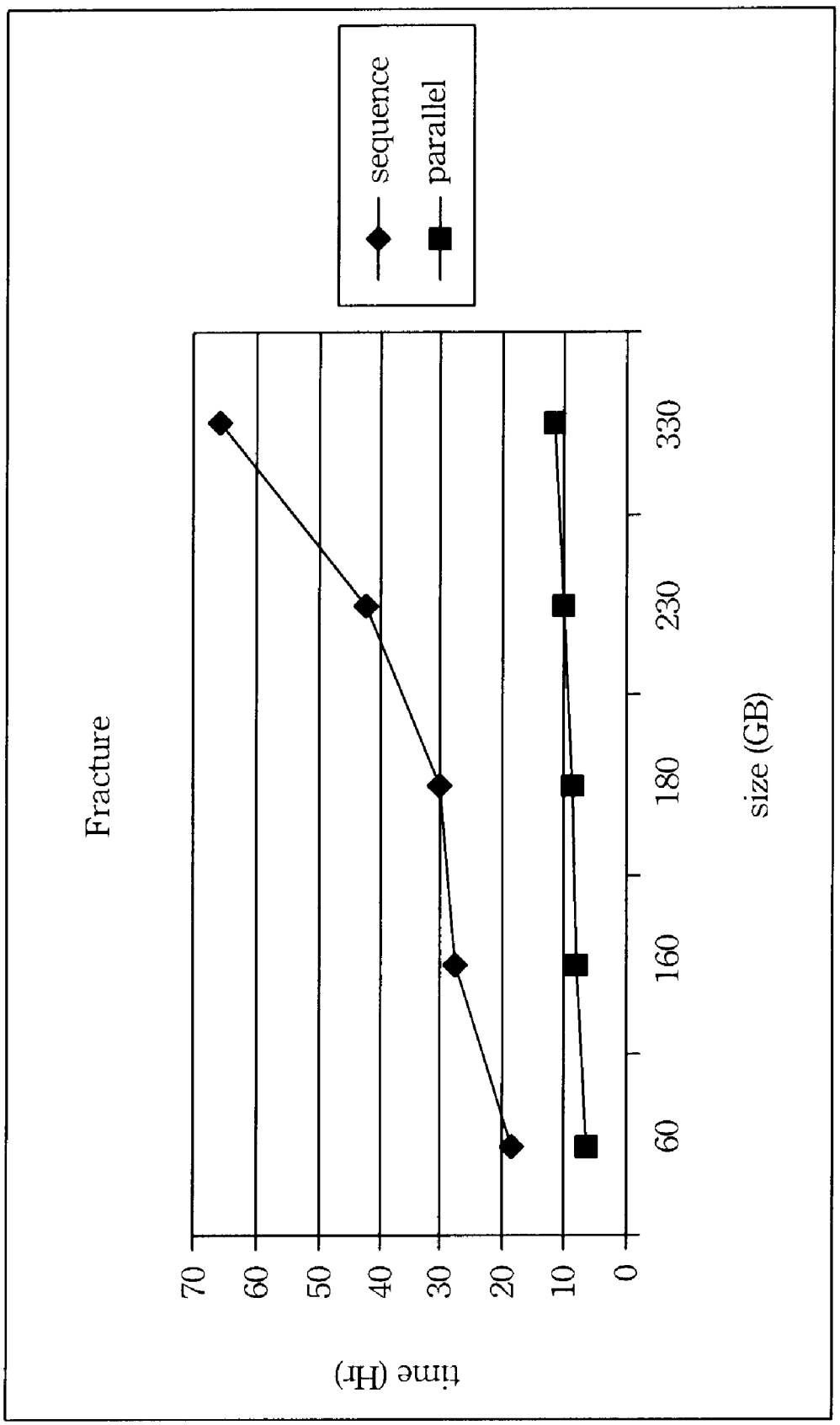
FIG. 8 is a diagram illustrating a new fracture process by implementing the parallel data preparation process of the present disclosure.

Referring to FIG. 8, the performance of the fracture process has improved since the implementation of the parallel data preparation process. For a data size of about 330 GB, the time required for performing the fracture process with the sequential method is about 65 hours. This is compared to the time required for the parallel data preparation process, which is less than 12 hours. Thus, for the fracture process alone, the time saving produced by parallel data preparation process of the present disclosure is over five times the sequential method. Although not shown in the Figure, the performance of the parallel data preparation process is well over 200 GB/hour. This minimizes the need for further investment, such as more advanced brand new linux cluster, additional CPUs and hardware equipment for processing the data files.

Figure 9:
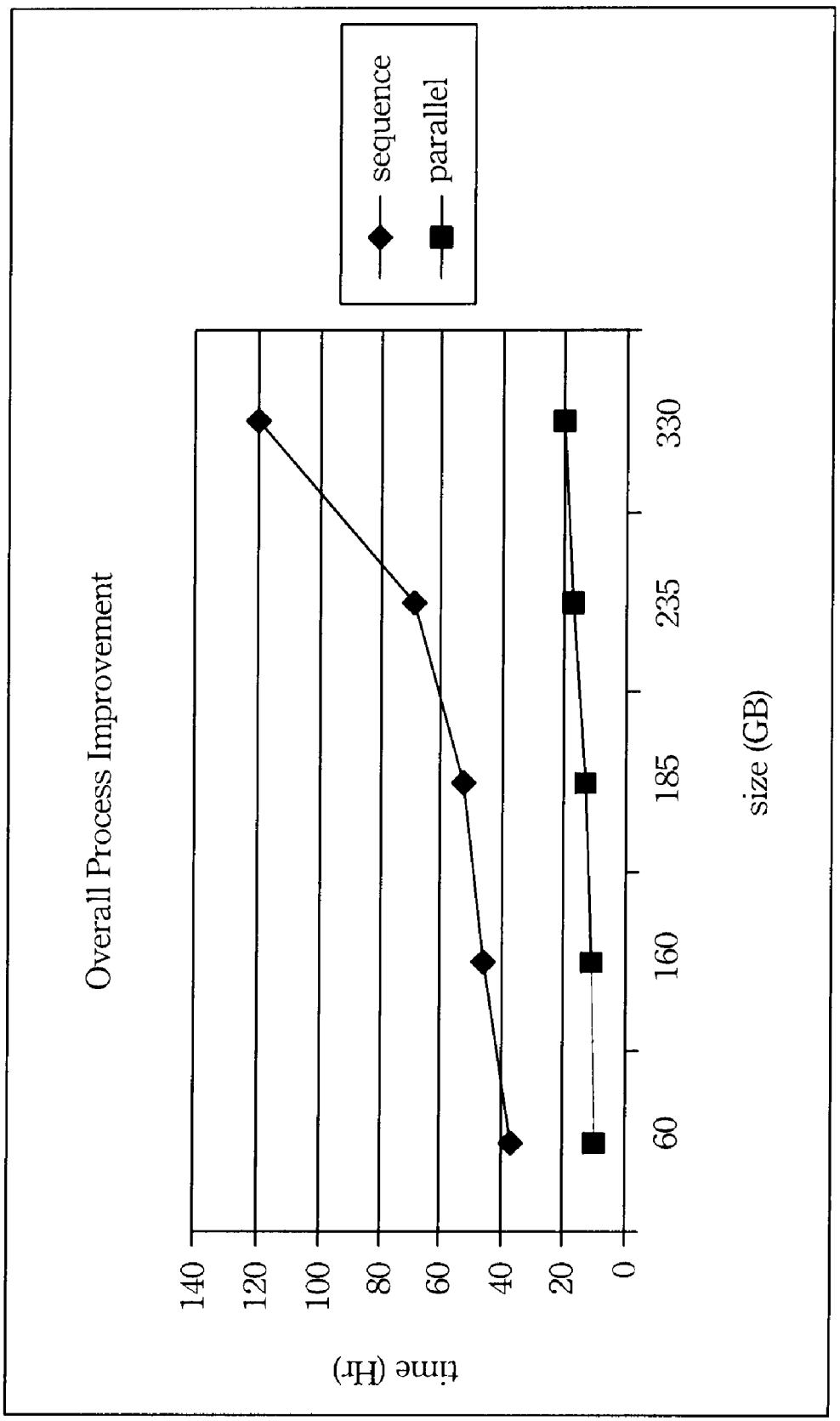
FIG. 9 is a diagram illustrating overall improvement by implementing the parallel data preparation process of the present disclosure.

Referring to FIG. 9, the overall improvement is greatly significant with the parallel data preparation process of the present disclosure. For a data size of about 330 GB, the time required for performing the entire data preparation process with the sequential method is about 122 hours. This is compared to the time required for performing the parallel data preparation process, which is about 20 hours. Thus, the time saving for the parallel process is over six times the sequential method.

In summary, aspects of the present disclosure provide a method for preparing mask or wafer data files. By providing a parallel process, the data preparation cycle time is shortened. In addition, less CPUs and hardware equipment are required to process the data files. It is noted that in addition to preparing data files for a mask writer, aspects of the present disclosure may be implemented as a method for preparing data files for writing a pattern directly to a wafer. For example, the parallel data preparation process may be implemented in an electron beam (e-beam) system that transfers a high-resolution pattern to a wafer. In this way, the data preparation cycle time and hardware resource required for writing a pattern directly to a wafer may also be improved.

In one embodiment, a method for converting a data file into a writer file for a mask writer is provided. A plurality of sub-files is created from the data file. The plurality of sub-files is transferred to the mask writer. A plurality of writer files is created from the plurality of sub-files at the mask writer. The plurality of transferred sub-files is checked at the mask writer and a mask is created at the mask writer using the plurality of writer files.

The creating of the plurality of sub-files from the data file comprises splitting the data file into a plurality of sub-files, and converting the plurality of sub-files into a plurality of flat poly format files. In addition, transferring the plurality of sub-files to the mask writer, creating a plurality of writer files from the plurality of sub-files at the mask writer, and checking the plurality of transferred sub-files at the mask writer are executed in parallel in a single process.

Furthermore, each of the plurality of sub-files is processed by at least one of the transferring step, the creating step, and the checking step at a same time. Each of the plurality of sub-file is transferred to the mask writer individually.

In another embodiment, a method for reducing preparation time of a data file of a wafer is provided. The data file is fractured into a plurality of sub-files. The plurality of sub-files is transferred to a writer and is converted to a plurality of writer files. A pattern is written to a wafer at the writer using the plurality of writer files. The plurality of writer files is checked for errors prior to being written to the wafer.

Fracturing the wafer data file into a plurality of sub-files comprises creating a plurality of sub-files by splitting the data file, and converting data of the plurality of sub-files into a flat poly format. The data of the plurality of writer files is in a format recognized by the writer.

The transferring of the plurality of sub-files to a writer, converting the plurality of sub-files to a plurality of writer files, and checking the plurality of writer files for errors are performed in parallel in a single process. In addition, at least one of the transferring step, the converting step, and the checking step is performed on each of the plurality of sub-files at a time. Fracturing the data file into a plurality of sub-files is being free from merging of the plurality of sub-files. Each of the plurality of sub-files is transferred to the writer individually in a single process.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method for converting a data file into a writer file for a mask writer, the method comprising:
    creating a plurality of sub-files from the data file;
    transferring the plurality of sub-files to the mask writer; and
    creating a plurality of writer files from the plurality of sub-files at the mask writer; and
    checking the plurality of transferred sub-files at the mask writer;
    wherein the steps of transferring the plurality of sub-files to the mask writer, creating a plurality of writer files from the plurality of sub-files at the mask writer, and checking the plurality of transferred sub-files at the mask writer are executed in parallel in a single process.

2. The method of claim 1, further comprising:
    creating a mask at the mask writer using the plurality of writer files.

3. The method of claim 1, wherein creating a plurality of sub-files from the data file comprises:
    splitting the data file into a plurality of sub-files; and
    converting the plurality of sub-files into a plurality of flat poly format files.

4. The method of claim 1, wherein transferring the plurality of sub-files to the mask writer are performed using a file transfer protocol.

5. The method of claim 1, wherein the plurality of writer files is a plurality of frame files.

6. The method of claim 1, wherein each of the plurality of sub-files is processed by at least one of the transferring step, the creating step, and the checking step at a same time.

7. The method of claim 1, wherein data of the data file is generated from an optical proximity correction.

8. The method of claim 1, wherein each of the plurality of sub-file is transferred to the mask writer individually.

9. A method for reducing preparation time of a data file of a wafer, the method comprising:
    fracturing the data file into a plurality of sub-files;
    transferring the plurality of sub-files to a writer;
    converting the plurality of sub-files to a plurality of writer files; and
    writing a pattern to a wafer at the writer using the plurality of writer files; and
    checking the plurality of writer files for errors;
    wherein the steps of transferring of the plurality of sub-files to a writer, converting the plurality of sub-files to a plurality of writer files, and checking the plurality of writer files for errors are performed in parallel in a single process.

10. The method of claim 9, wherein fracturing the wafer data file in to a plurality of sub-files comprises:
    creating a plurality of sub-files by splitting the data file; and
    converting data of the plurality of sub-files into a flat poly format.

11. The method of claim 9, wherein transferring of the plurality of sub-files to a writer is performed using a file transfer protocol.

12. The method of claim 9, wherein data of the plurality of writer files is in a format recognized by the writer.

13. The method of claim 9, wherein writing a pattern to a wafer at the writer using the plurality of writer files comprises:
    directly writing a pattern to the wafer by an electron beam writer using the plurality of writer files.

14. The method of claim 9, wherein at least one of the transferring step, the converting step, and the checking step is performed on each of the plurality of sub-files at a time.

15. The method of claim 9, wherein the fracturing the data file into a plurality of sub-files is being free from merging of the plurality of sub-files.

16. The method of claim 9, wherein transferring of the plurality of sub-files to a writer comprises:

transferring each of the plurality of sub-files individually in a single process.

17. A method for providing a pattern file to a writer, comprising:

splitting the pattern file into a plurality of flat-poly sub-files;

transferring the plurality of flat-poly sub-files to the writer;

creating a plurality of writer files from the transferred flat-poly sub-files; and writing a pattern onto a substrate using the plurality of writer files; and checking the transferred plurality of flat-poly sub-files at the writer;

wherein the steps of transferring of the plurality of flat-poly sub-files to the writer, creating a plurality of writer files from the transferred flat-poly sub-files, and checking the transferred plurality of flat-poly sub-files at the writer are performed in parallel in a single process.

\* \* \* \* \*